US007085661B2

United States Patent
Emori et al.

(10) Patent No.: US 7,085,661 B2
(45) Date of Patent: Aug. 1, 2006

(54) STATE DETECTING SYSTEM AND DEVICE EMPLOYING THE SAME

(75) Inventors: Akihiko Emori, Hitachi (JP); Akihiko Kudou, Fukaya (JP); Shigeyuki Yoshihara, Hitachinaka (JP); Hideki Miyazaki, Hitachi (JP); Toshisada Mitsui, Hitachinaka (JP); Mitsuyuki Hombu, Hitachinaka (JP); Kazuyoshi Sasazawa, Hitachi (JP)

(73) Assignees: Hitachi, Ltd., Tokyo (JP); Shin-Kobe Electric Machinery Co., Ltd., Tokyo (JP)

( * ) Notice: Subject to any disclaimer, the term of this patent is extended or adjusted under 35 U.S.C. 154(b) by 0 days.

(21) Appl. No.: 11/033,057

(22) Filed: Jan. 10, 2005

(65) Prior Publication Data

US 2005/0119856 A1 Jun. 2, 2005

Related U.S. Application Data

(63) Continuation of application No. 10/387,524, filed on Mar. 14, 2003, now abandoned.

(30) Foreign Application Priority Data

Apr. 10, 2002 (JP) .............................. 2002-107861

(51) Int. Cl.
*G01R 31/36* (2006.01)
*H02J 7/00* (2006.01)
(52) U.S. Cl. ........................... 702/63; 702/85; 320/132
(58) Field of Classification Search ................. 702/60, 702/63–65, 85, 89, 123, 182, 183; 320/132, 320/149; 324/427, 428; 340/636.1, 636.12, 340/636.13, 636.15, 636.19, 636.2

See application file for complete search history.

(56) References Cited

U.S. PATENT DOCUMENTS

| 5,892,346 | A  | * | 4/1999  | Moroto et al. ............... 318/587 |
| 5,949,217 | A  | * | 9/1999  | Okada et al. ................ 320/132 |
| 6,051,957 | A  | * | 4/2000  | Klein ........................... 320/132 |
| 6,307,351 | B1 | * | 10/2001 | Yokoyama ................... 320/132 |

FOREIGN PATENT DOCUMENTS

| JP | 11-289734 |   | 10/1998 |
| JP | 11-218567 |   | 8/1999  |
| JP | 2000-166105 |   | 6/2000  |
| JP | 2000-166109 |   | 6/2000  |
| JP | 2000166109 A | * | 6/2000 |
| JP | 2001-85071 |   | 3/2001  |

* cited by examiner

*Primary Examiner*—Marc S. Hoff
*Assistant Examiner*—Manuel L. Barbee
(74) *Attorney, Agent, or Firm*—Crowell & Moring LLP (57) ABSTRACT

A state detecting system which can detect state of power storage at high precision even with lesser characteristic data to be used for calculation, and a device employing the same. The state detecting system has a memory for storing a characteristic data, calculation information, and set information, an arithmetic unit for calculating state information indicative of state of said power storage and calculating correction information for performing correction, a first correcting unit for correcting input of said arithmetic means, and a second correcting unit for correcting information stored or set in the storage.

25 Claims, 7 Drawing Sheets

1102 PHOTOVOLTAIC GENERATION EQUIPMENT

FIG. 10
PRIOR ART

STATE DETECTING SYSTEM AND DEVICE EMPLOYING THE SAME

BACKGROUND OF THE INVENTION

The present invention relates to a novel state detecting device for detecting states such as charge condition, residual capacity in a power storage means such as a lithium secondary battery, a nickel hydride battery, a lead seal battery, an electric double layer capacitor, and to a power source unit, a distribution type power storage device, and an electric vehicle which use the state detecting device.

In a power source unit, a distribution type power storage device and an electric vehicle employing power storage means, such as a battery, a state detecting device is employed for detecting state of the power storage means in order to safely and effectively use the power storage means. The state of the power storage means represents state of charge (hereinafter abbreviated as "SOC" indicative how much charged or how much dischargeable charge amount resides, residual capacity, or state of health (hereinafter abbreviated as "SOH") indicative of how much exhausted or weakened or degree of deterioration.

The SOC in the power source unit of a portable equipment, an electric vehicle and so forth can be detected by integrating a discharge current from a fully charged state and calculating a ratio of a charge amount residing in the power storage means (hereinafter referred to as "residual capacity") versus a maximum chargeable charge amount (hereinafter referred to as "full capacity"). However, many power storage means varies the full capacities depending upon SOH, temperature and so forth, it is difficult to accurately detect SOC with respect to secular change and variation of environment.

Figure 10:
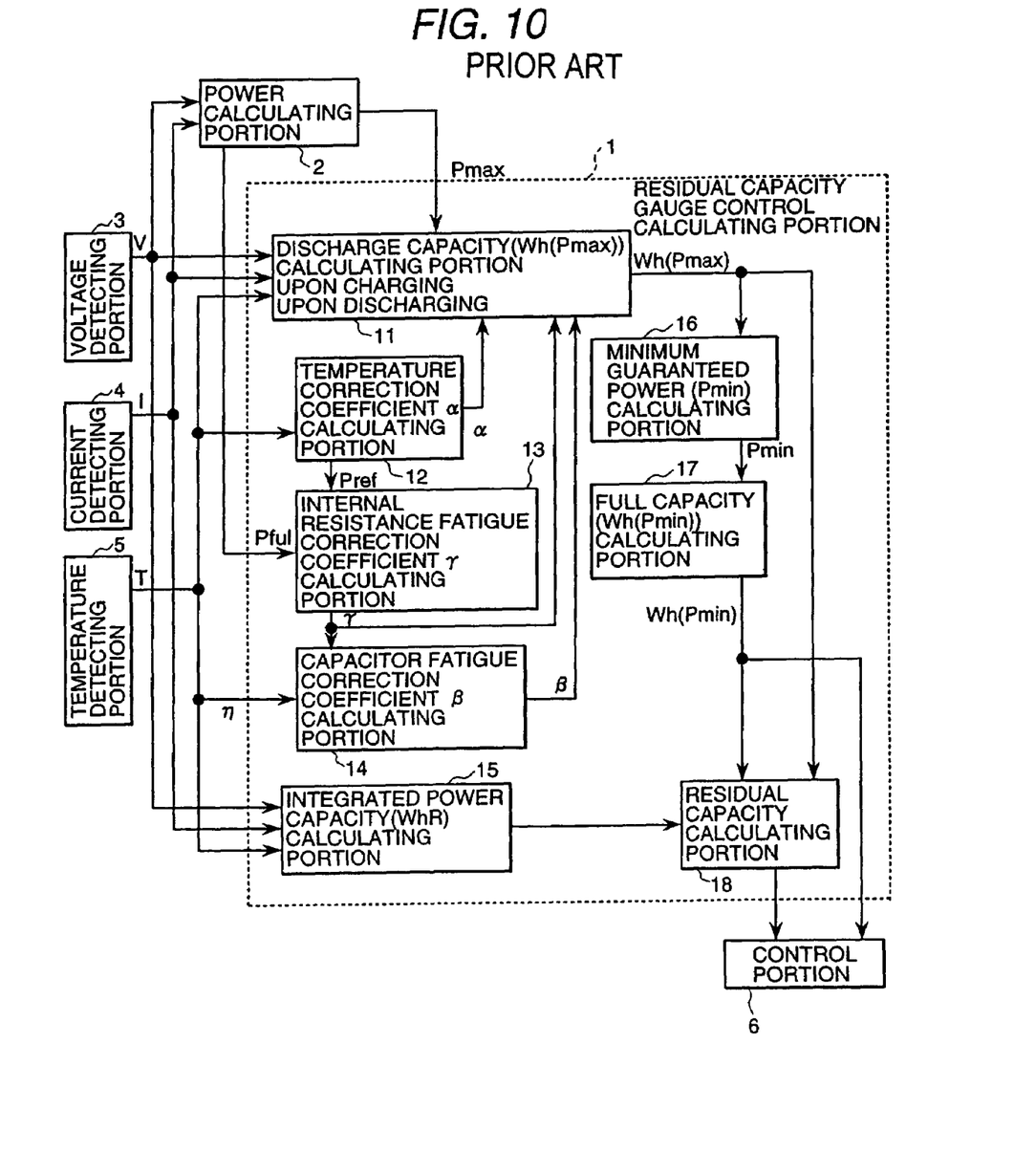
FIG. 10 is a constructional illustration showing the conventional residual capacity predicting method.

In order to solve such problem, as conventional residual capacity predicting method in consideration of deterioration of battery, there has been known one disclosed in Japanese Patent Application Laid-Open No. Heisei 10-289734. FIG. 10 is an illustration showing a residual capacity predicting method of the above-identified publication. In this method, an initial battery characteristics is corrected by a temperature correction coefficient derived on the basis of a temperature of the battery and a deterioration correction coefficient derived based on deterioration of the battery, and a residual capacity of the battery is derived on the basis of the corrected battery characteristics, a discharge current during discharging and a terminal voltage.

In Japanese Patent Application Laid-Open No. Heisei 11-218567, there is shown a method for deriving a battery characteristics upon occurrence of deterioration by correcting an initial battery characteristics in relation to a temperature correction coefficient, an internal resistor deterioration correction coefficient, a capacitor deterioration correction coefficient.

In Japanese Patent Application Laid-Open No. 2000-166105, there has been disclosed a control unit detecting a charge condition on the basis of charge and discharge current, detecting a power storage condition on the basis of a voltage and controlling a charge condition on the basis of such detections.

In Japanese Patent Application Laid-Open No. 2000-166109, there has been disclosed a charge condition detecting device deriving an electromotive force based on a charge and discharge current and voltage and having a calculating means for deriving a charge characteristics on the basis of the electromotive force and the charge characteristics.

In Japanese Patent Application Laid-Open No. 2001-85071, there is disclosed a temperature detecting device predicting respective temperatures of a set battery modules on the basis of voltages between terminals and currents flowing therethrough.

In the residual capacity predicting method disclosed in the foregoing Japanese Patent Application Laid-Open No. Heisei 10-289734, in consideration of influence for temperature or deterioration, these influences are taken in as temperature correction coefficient or deterioration correction coefficient for correcting parameters necessary for calculation of the residual capacity with these correction coefficients derived through complicate derivation processes. Therefore, it is concerned whether the value per se of the correction coefficient is correct or whether all battery characteristics are corrected.

In addition, the power storage means of some kind also has characteristics, such as charge efficiency, memory effect and so forth, and is required to make correction in consideration of these characteristics in precision of residual capacity with high precision. On the other hand, the initial characteristics of the power storage mean generally contain individual difference. Correction for individual difference is also necessary in prediction of residual capacity with high precision.

Namely, in order to perform state detection, such as prediction of residual capacity with high precision, it becomes necessary to effect accurate modeling of the characteristics to take in a plurality of parameters. Furthermore, it is required to perform correction associated with secular change or environmental variation of these parameters.

Therefore, significant time and attention have to be paid for obtaining the initial characteristics and a plurality of parameters of the power storage means. However, no matter how complicated it is, the result of arithmetic operation is nothing but prediction on the basis of the theory or model of the battery characteristics. Therefore, it is stilled concerned whether the result of prediction is correct with respect to a true value.

Therefore, it has been found that, in order to realize state detection of the power storage means at high precision and simply in calculation with characteristic data to be used in arithmetic operation, correction by comparing the result of state detection with the true value or logic and feeding back to subsequent arithmetic operation with learning the difference, is required, and break through thereof is necessary. Since it is not possible to directly measure the state of the battery, such as SOC or SCH, an important problem is how to derive the true value or logic.

On the other hand, in Japanese Patent Application Laid-Open No. Heisei 11-218567, Japanese Patent Application Laid-Open No. 2000-166105, Japanese Patent Application Laid-Open No. 20000-166109 and Japanese Patent Application Laid-Open No. 2001-85071, it is failed to disclose to perform correction feeding back a correction information obtained through arithmetic operation to subsequent arithmetic operation, and to correct storage information necessary for the arithmetic operation, and to perform state detection of the power storage means on the basis of a plurality of particular arithmetic operation and a plurality of varying information.

SUMMARY OF THE INVENTION

An object of the present invention is to provide a state detection system to perform correction for feeding back correction information obtained through the predetermined arithmetic operation to subsequent arithmetic operation and storage information to make a characteristic data to be used in arithmetic operation at least being accurate to enable detection of state, such as state of charge, state of health or the like, and a power source unit, a power storage device and an electric vehicle.

The present invention is directed to a state detecting system comprising a storage means for storing a characteristic data with respect to a power storage means arithmetically obtained on the basis of the measured information obtained by measuring a measuring object with respect to the power storage means by measuring means, calculation information relating to the arithmetic operation of the data, and set information preliminarily set relating to the characteristic data and the calculation information, an arithmetic means for calculating state information indicative of state of the power storage means on the basis of the measured information and set information and calculating correction information for performing correction by comparing a calculation result calculated and the set information, a first correcting means for correcting input of the arithmetic means on the basis of correction information obtained by the arithmetic means, or a second correcting means for correcting information stored or set in storage means based on correction information obtained by the arithmetic means, and a communication means for communicating a calculation result obtained from the arithmetic means to other device.

More particularly, the state detecting system according to the present invention comprises a measuring means for measuring one or more of voltage, current, temperature, resistance and electrolyte concentration of a power storage means, a storage means for storing at least one of characteristic data of the power storage means, calculation coefficient and calculation procedure and preliminarily set value to be considered as true value or set information to be a logic considered as true phenomenon, an arithmetic means for calculating state of the power storage means on the basis of the measured value of the measuring means and the set information of the storage means and calculating a correction amount by comparing the calculation result and the set information, and communication means for communicating the calculation result of the arithmetic means to other device, and a correcting means for correcting the value of the storage means or input of the arithmetic means. By this, it can perform correction by comparing the calculation result and set information and feeding back the difference to subsequent calculation with learning. Therefore, it can be realized the state detection system which can detect state of power storage means achieving high accuracy with requiring lesser characteristic data to be used and simply in calculation.

The correction means according to the present invention may determine a correction amount based on discrepancy of the calculation result of the calculation means and set information. For example, it is natural condition that charge state increases during charging. If discrepancy in that the charge state decreases during charging, this is corrected. In addition, it is natural when charge and discharge is performed within the allowable charge an discharge current value capable of charging and discharging the power storage within allowable use voltage range, overcharging or over discharging is not detected. If overcharging or over discharging is detected, allowable charge and discharge current is corrected. As set forth, according to the present invention, normal characteristics or natural phenomenon is taken as set information and compares with the calculation result to correct the value of the storage means or input of the arithmetic means is corrected with learning.

On the other hand, in the present invention, the value of the measuring means, calculation result or calculation procedure of the arithmetic means, when the current value is smaller than or equal to the predetermined value may be determined as the correction value. For example, under a condition where influence of self-discharge is small and if current value is 0A, charge state varies little. Namely, when current value is 0A, variation amount of charge state being 0 is taken as set value as true value. If current value is 0A, charge state is varied; correction is performed to feedback the variation amount to the subsequent calculation with learning.

The storage means of the present invention has two or more mutually different calculation procedures. The arithmetic means can derive the correction value from the calculation results of the calculation procedures to perform correction for feeding back the correction value to the subsequent calculation with learning.

On the other hand, the arithmetic means has the charge state calculating means and current integration means of the power storage means to calculate capacity of the power storage means based on different two charge state and current integration value die the period. In this case, the storage means stores the initial capacity of the power storage means, and correction means may determine the correction information based on the capacity and initial capacity of the power storage means.

The present invention is characterized by a power source unit comprising power storage means, measuring means for measuring at least one of voltage, current, temperature, electric resistance and electrolyte concentration, and a state detecting system deriving state information of the power storage means on the basis of measured information measured by the measuring means, the state detecting system comprising state detecting system set forth above.

On the other hand, the present invention is characterized by a power storage device comprising a commercial power source connected to a switch, a photovoltaic generation device connected to the commercial power source via the switch, a load device connected to the photovoltaic generation device via a switch, a control converter controlling power of the commercial power source and the photovoltaic generation device and connected to the switch of the commercial power source via a switch, a control unit commanding switching of the switch of the commercial power source and the switch of the control converter and commanding the power, power storage means, measuring means for measuring at least one of voltage, current, temperature, electric resistance and electrolyte concentration, and a state detecting system deriving state information of the power storage means on the basis of measured information measured by the measuring means, the state detecting system comprising state detecting system set forth above.

The present invention is characterized by an electric vehicle comprising a generator performing power generation by revolution and rotation of a motor for driving wheel and the wheel or motor generator driving wheel and performing power generation by rotation of the wheel, a control converter connected to the motor and generator or the motor generator and converting a power thereof, a control unit designating the power of the control converter, power storage means connected to the control converter, a measuring means for measuring at least one of voltage, current, temperature, electric resistance and electrolyte concentration, and a state detecting system deriving state information of the power storage means on the basis of measured information measured by the measuring means, the state detecting system comprising state detecting system set forth above, and the control unit being controlled by a communication means.

The present invention is characterized by a hybrid vehicle comprising an internal combustion engine, a generator performing power generation by revolution of motor assisting driving force of wheel connected to the engine and rotation of wheel and a motor generator connected to the engine and assisting driving force of the engine and performing power generation, a control converter connected to the motor and the generator or the motor generator, for converting a power thereof, a control unit designating the power of the control converter, a power storage means connected to the control converter, a measuring means for measuring at least one of voltage, current, temperature, electric resistance and electrolyte concentration, and a state detecting system deriving state information of the power storage means on the basis of measured information measured by the measuring means, the state detecting system comprising state detecting system set forth above, and the control unit being controlled by a communication means.

It is preferred that the power storage means is selected among lithium secondary battery, a nickel hydride battery, a lead seal battery, an electric double layer capacitor and so forth.

As set forth above, by the present invention, since correction is performed by comparing the calculation result with the set information, such as set value or logic of the calculation result to feedback to the subsequent calculation with learning. Therefore, state detecting system detecting state information of the power storage means with high precision with smaller characteristic data to be used for calculation with using simple arithmetic expression for calculation, the power source unit, distributed type power storage device, the automotive vehicle, can be realized.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

DETAILED DESCRIPTION OF THE PREFERRED EMBODIMENTS

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscurity of the present invention.

FIRST EMBODIMENT

Figure 1:
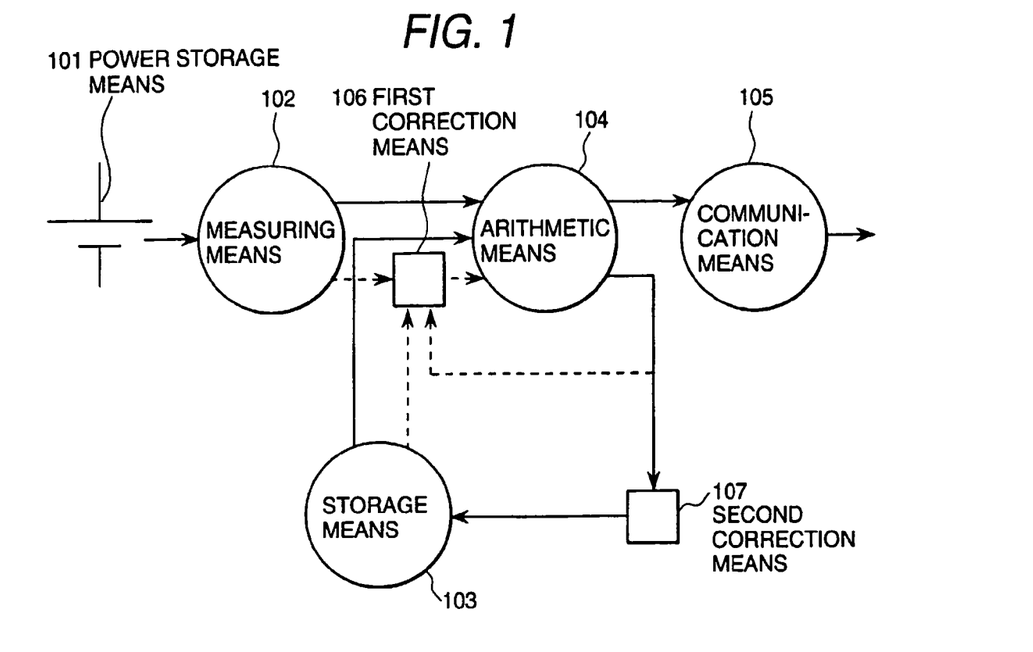
FIG. 1 is a constructional illustration of a power source unit according to the present invention.

FIG. 1 is a constructional illustration of a power source unit according to the present invention. In FIG. 1, the reference numeral 101 denotes power storage means, 102 denotes measuring means, 103 denotes storage means, 104 denotes arithmetic means, 105 denotes communication means, 106 denotes first correction means and 107 denotes second correction means. The power storage means 101 is formed with a device having a power storage function, such as a lithium secondary battery, a nickel hydride battery, a lead seal battery, an electric double layer capacitor and so forth.

The measuring means 102 is formed with a sensor or an electric circuit measuring voltage, current, temperature, resistance, battery electrolyte concentration and so forth, to obtain necessary measured information.

The storage means 103 is constructed with a memory device, such as an EEPROM, flash memory, a magnetic disk and so forth to store calculation information including at least one of characteristic data, calculation coefficient and calculation procedure, and set value to be considered as a preliminarily set true value relating to the calculation information or set information consisted of logic considered as true phenomenon.

The arithmetic means 104 is formed with a microprocessor, a computer or the like, and derives a state information of the power storage means 101 on the basis of a measuring value of the measurement means 102 and a value of the storage means 103. On the other hand, the result of calculation and the set information are compared to calculate the correction information to be these correction amounts. As state of the power storage means 101, there are various abnormality, such as SOC, SOH, allowable current, continuous charge and discharge period, allowable temperature, overcharging, over discharging and so forth.

The communication means 105 is constructed with a device or circuit for communicating a serial number, such as CAN, Bluetooth and so forth or a device or circuit communicating an ON-OFF signal, such as photo-coupler, relay and so forth. Then, a result of calculation calculated by the arithmetic means 104 is transmitted to other controller, display element or the like (not shown).

The first correction means 106 is constructed with a cache memory, a buffer memory, such as SRAM or the like, a register. Correction is performed by varying a value of the measuring means 102, a value of the storage means 103, a result of calculation of the arithmetic means 104 on the basis of a correction value derived by the arithmetic means 104.

The second correction means 107 is constructed with a writing circuit of EEPROM, flash memory and so forth as the storage means 103 or a writing circuit of the magnetic disk or the like and re-writes the value in the storage means 103 based on the correction value calculated by the arithmetic means 104.

While the first correction means 106 and the second correction means 107 are employed in the shown embodiment, it is possible to use one of these correction means or to employ other construction. On the other hand, by employing a microcomputer, in which an A/D converter, a flash memory, a microprocessor, a communication circuit are integrated on the same device, the measuring means 102, the storage means 103, the arithmetic means 104, the communication means, the first correction means 106 and the second correction means 107 can be integrated on the same device. On the other hand, these can be used in common with other control unit.

With the shown embodiment, the result of calculation per se is compared with the set value or the set information set as logic to perform correction with feeding back to subsequent arithmetic operation with learning the difference between the result of calculation and the set value or the set information. Therefore, it becomes possible to realize the state detection method and state detection system of the power storage means which is high accuracy with lesser characteristic data to be used in arithmetic operation and simple in arithmetic operation, and a power source unit employing the same.

SECOND EMBODIMENT

Figure 2:
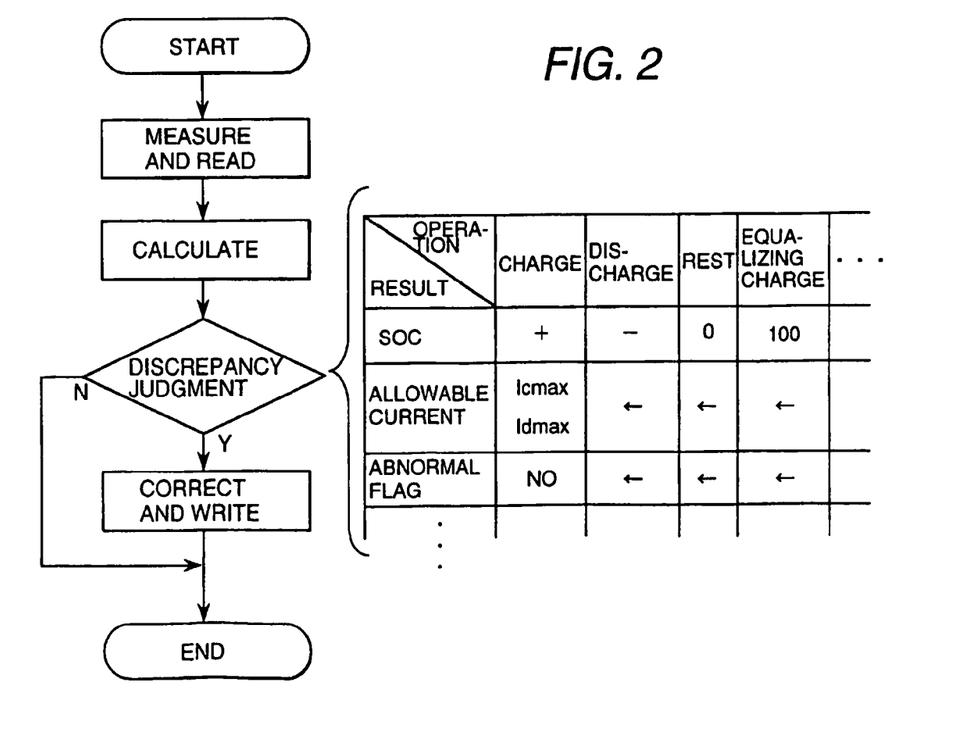
FIG. 2 is a block diagram sowing a calculation process of the power source unit according to the present invention.

FIG. 2 is a block diagram showing a state detection method of the power storage means according to the present invention. In FIG. 2, in a step of measuring and reading, voltage, current, temperature, resistance, electrolyte concentration and so forth of the power storage means 101 is measured to read the measuring value of the first correction means 106 or the arithmetic means 104 or a value of the storage means 103. In calculation, state of the power storage means 101 is calculated on the basis of the read value. In discrepancy judgment, the result of calculation and the set value or logic is compared to make judgment of discrepancy. If no discrepancy is found, process does end to repeat the same sequence. If discrepancy is found, related parameters are corrected at a step of correction and writing to terminate writing in the memory. By repeating this sequence, correction to feed back the discrepancy to subsequent arithmetic operation with learning can be performed.

Here, discrepancy between the result of calculation and the set value or logic means that, for example, it is natural logic to increase charge state during charging, discrepancy is found when the charge state is decreased during charging. Also, it is similarly the logic that the charge state is decreased during discharging, or charge state is not varied under the condition where influence of self-discharge can be ignored during resting. If discrepancy is case to this, correction is effected. Then, matrixing of such items may be performed to make discrepancy judgment with taking the matrix as discrepancy matrix.

While it is not possible to directly measure the state of the power storage means, the foregoing obvious phenomenon or characteristics are taken as set information to compare with the result of calculation. If discrepancy is found, the value of the storage means and the input of the arithmetic means are corrected with learning.

By this, it becomes possible to realize the state detection system of the power storage means which is high accuracy with lesser characteristic data to be used in arithmetic operation and simple in arithmetic operation, and a power source unit employing the same.

Figure 3:
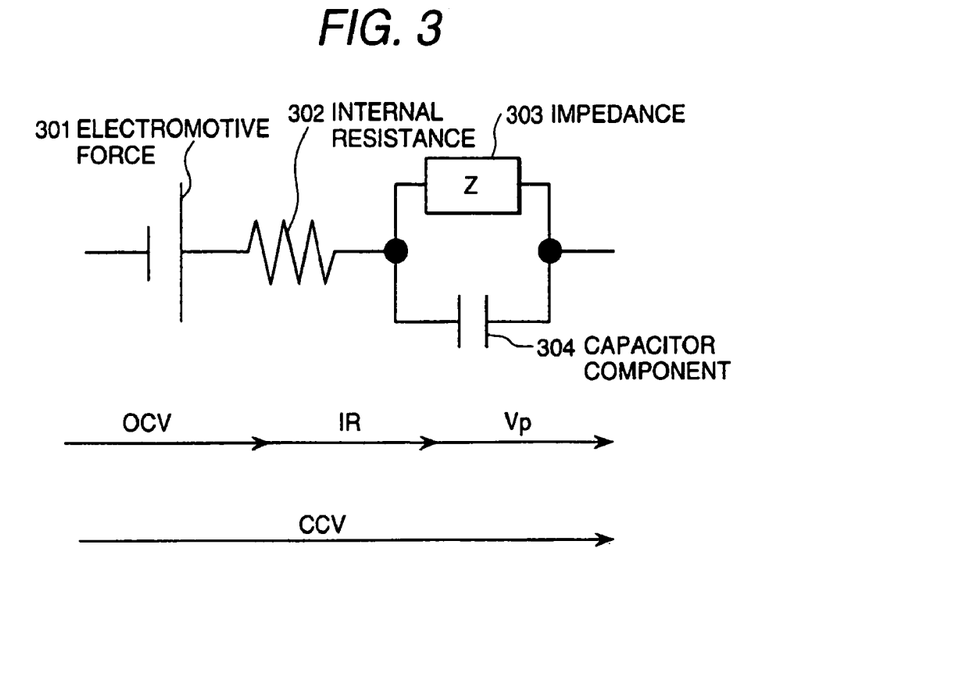
FIG. 3 is a circuit diagram showing an equivalent circuit of a power storage means according to the present invention.

FIG. 3 is a circuit diagram showing an equivalent circuit of the power storage means. In FIG. 3, the reference numeral 201 denotes an electromotive force (OCV), 302 denotes an internal resistor (R), 303 denotes an impedance (Z), 304 denotes a capacitor component (C). There are illustrated a parallel connection pair of the impedance 303 and the capacitor component 304 and a series connection of the internal resistor 302 and the electromotive force 301. When a current I is applied to the power storage means, a voltage (CCV) between the terminals of the power storage means is expressed by an equation (1).

$$CCV = OCV + IR + Vp \quad (1)$$

wherein Vp is polarized voltage, Z and C are voltages of the parallel connection pair.

OCV is used for calculation of SOC or allowable charge and discharge current. In the condition where the power storage means is charged and discharged, it is not possible to directly measure OCV. Therefore, OCV is derived by subtracting IR drop and Vp from CCV as expressed by the following equation (2).

$$OCV = CCV - IR - Vp \quad (2)$$

Figure 4:
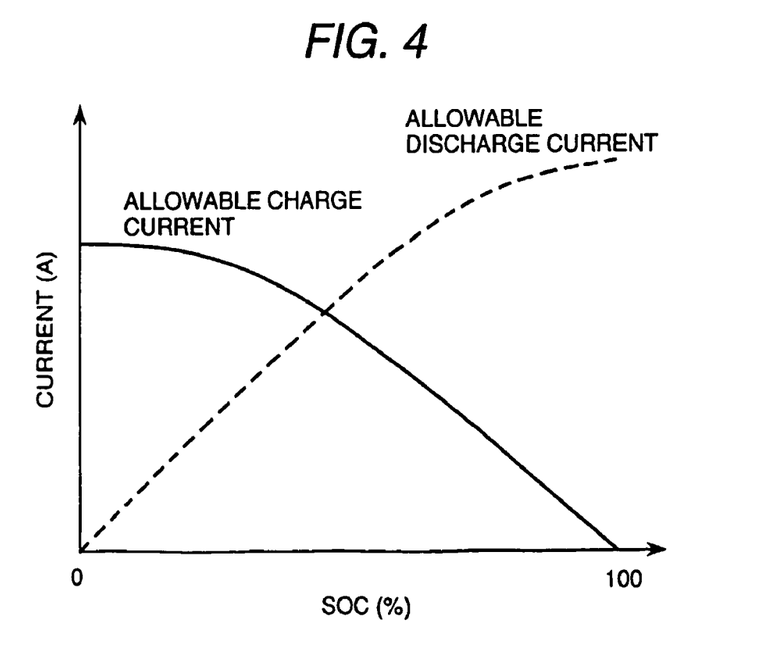
FIG. 4 is a diagrammatic illustration showing a relationship between SOC and allowable charge and discharge current of power storage means according to the present invention.

FIG. 4 is a diagrammatic illustration showing SOC, an allowable charge current and allowable discharge current of the power storage means. Associating with increase of SOC, the allowable discharge current is increased and allowable charge current is decreased. Assuming the maximum allowable voltage of the power storage means is Vmax and minimum allowable voltage is Vmin, the allowable charge current Icmax and allowable discharge current Idmax are respectively expressed by the following equations (3) and (4).

$$I_c\text{max} = (V\text{max} - OCV)/Rz \quad (3)$$

$$I_d\text{max} = (OCV - V\text{min})/Rz \quad (4)$$

wherein Rz is equivalent impedance of R, Z, C in FIG. 3.

Accordingly, upon discrepancy is found in that overcharging or over discharging is detected upon charging and discharging at a current smaller than or equal to Icmax and Idmax, the value of Rz is corrected. For example, Rz is increased by 1%.

Figure 5:
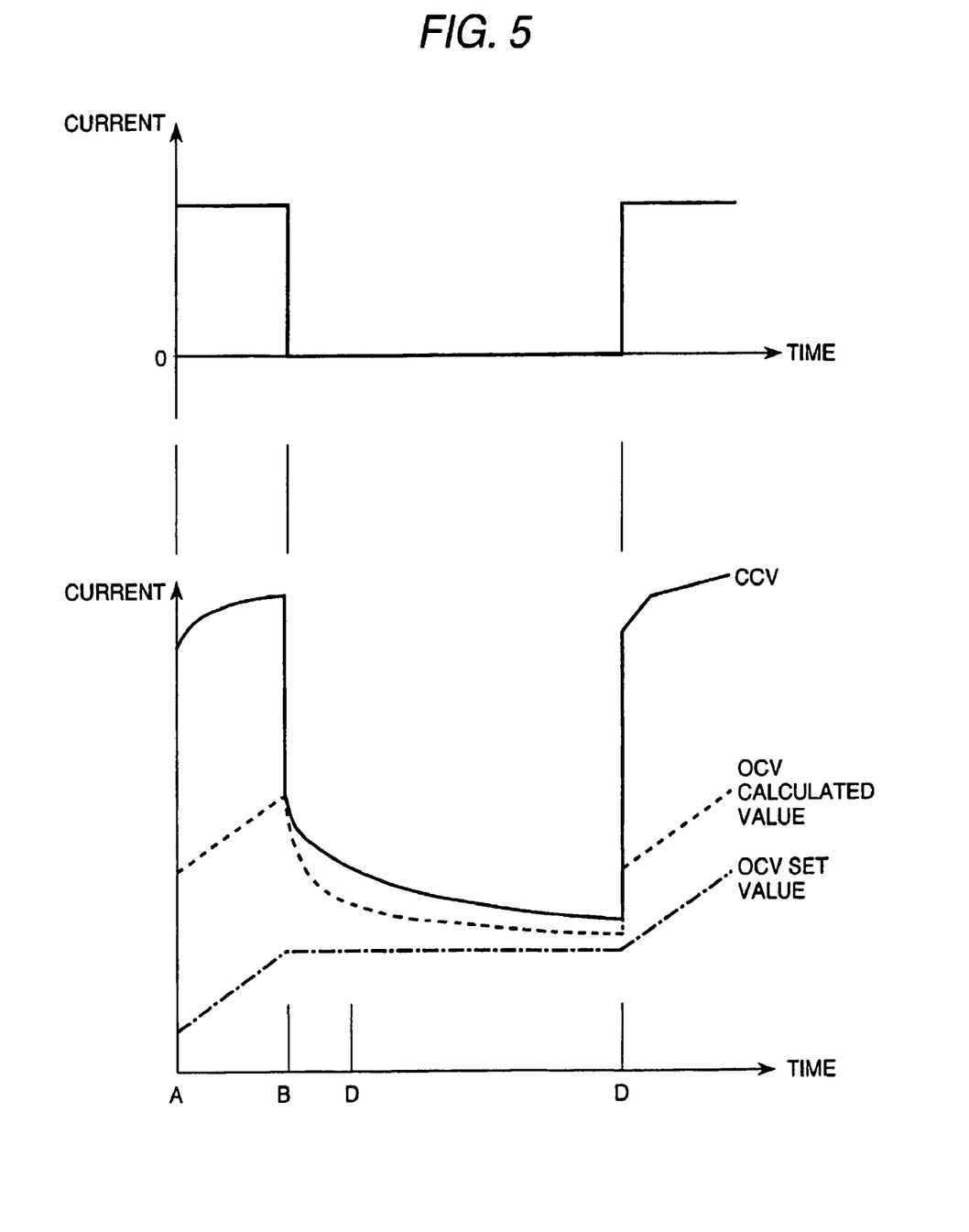
FIG. 5 is a diagrammatic illustration showing a voltage variation upon charging by a pulse current of the power storage means according to the present invention.

FIG. 5 is a diagrammatic illustration showing variation of voltage during charging by a pulse current of the power storage means. A curve of CCV shown by a solid line is risen from a charge start timing (A) and is abruptly drops at a charge terminating timing (B). Dropping is due to IR drop. Subsequently, CCV is decreased moderately to gradually approach to the set information of OCV shown by one-dotted line. A voltage variation in this period mainly corresponds to Vp. On the other hand, the set information of OCV not influenced by the IR drop or Vp is increased from A to B during charging but is not varied during a period between B where a current is 0A to D (under the condition where influence of self-discharge or environmental temperature can be ignored). In contrast to this, the calculated value of OCV shown by broken line is not consistent with the set information of OCV, and shows moderately decreasing curve even from B to D.

When the equation (2) is used in calculation of OCV, R can be directly obtained by actually measuring CCV and I and expressed by the following equation (5) using variation amount dCCV and dI in a short period.

$$R = dCCV/dI \quad (5)$$

Therefore, with the present invention, taking the fact that variation of OCV is 0V at 0A as set value, for example, when the calculated value of OCV during this period is varied as shown in FIG. 5, Vp is corrected.

On the other hand, when SOC is derived from OCV, the set value or logic of SOC and the calculated value are also varied as shown in FIG. 5. Even in this case, it becomes possible to detect discrepancy of Vp. Then, after correction of Vp, it is fed back to subsequent calculation.

THIRD EMBODIMENT

The table 1 is a table showing a relationship between variation of SOC of the present invention and correction amount of Vp. With taking a time scale as t, and taking a timing where the current value becomes 0A as t=0, the correction amount of Vp is determined from variation of SOC at t<0 and variation of SOC at t>0. For example, if variation of SOC at t<0 is increase and variation of SOC at t>0 is also increase, Vp is decreased by 1%.

TABLE 1

| SOC Variation (t < 0) | Soc Variation (t > 0, Current 0A) | Vp Correction |
|---|---|---|
| Increase | Increase | −1% |
| Increase | Decrease | +1% |
| Decrease | Increase | +1% |
| Decrease | Decrease | −1% |

Then, these calculation is repeated for a plurality of times as time elapsed. By this, Vp gradually approaches to the set value by learning effect. Namely, Vp is automatically tuned.

While the absolute value of the correction amount is uniform at 1% here, it is preferred that this value is optimized depending upon kind of the power storage means, current pattern of the load, measurement error of the measuring means and so forth. On the other hand, as shown, it is preferred to apply Fuzzy theory for indicating direction of correction.

While state of the power storage means cannot be measured directly similarly to SOC or OCV, according to the present invention, the characteristics or normal phenomenon in the period where the current value is less than or equal to a predetermined value set forth above as set value or logic, the correction amount is derived by Fuzzy theory by comparing the result of calculation per se. This is fed back tot he subsequent calculation to repeat learning calculation.

Therefore, whenever calculation is repeated, precision can be improved. On the other hand, since the individual difference of the initial characteristics, environment dependency, secular change and so forth are automatically tuned. Thus, these plurality of parameters and data of correction coefficient can be eliminated.

For example, in the foregoing example, Vp depends on complicate parameter, such as individual difference or secular change, and further individual difference of secular change and so forth. Upon modeling and reproducing these parameters accurately for taking in calculation, it becomes necessary to obtain the initial characteristics, a plurality of parameters, data to require substantial period and load.

However, in the present invention, influence of these individual difference, secular change and so forth are calculated with learning under actual use environment, these parameters are not required.

FOURTH EMBODIMENT

Figure 6:
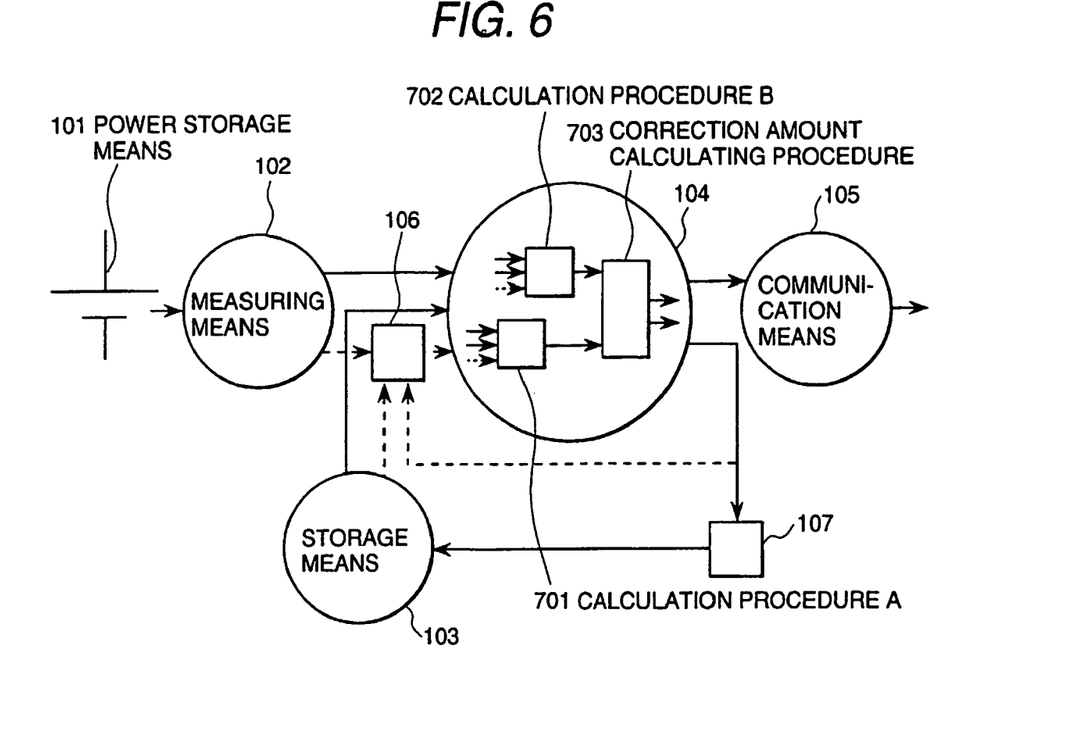
FIG. 6 is a constructional illustration of the power source unit according to the present invention.

FIG. 6 is a constructional illustration of the power source unit according to the present invention. In FIG. 6, the reference numeral 701 denotes a calculation procedure A, 702 denotes a calculation procedure B, 703 denotes a correction amount calculation procedure. The arithmetic means 104 shows a part of the calculation procedure, and the arithmetic means have the arithmetic procedure A and the arithmetic procedure B.

For example, the calculation procedure A 701 is taken as arithmetic procedure of SOC (hereinafter referred to as SOCV) derived from OCV set forth above, and the calculation procedure B 702 is taken as calculation procedure of SOC (hereinafter referred to as SOCi based on a current integration. In calculation of SOCi, the equation (6) is used.

$$SOCi = SOCo + 100 \times d\,I/Q \quad (6)$$

wherein SOCo is an initial value of SOC upon starting of charging and discharging, d I is a various amount of the current integrated value, Q is a maximum chargeable charge amount (full capacity). Assuming a charge efficiency of the power storage means as ç, an integrated charge current as Ic and an integrated discharge current as Id, d I is expressed by the following equation (7)

$$d\,I = ç \times Ic - Id \quad (7)$$

SOCi is superior in indicating variation amount in a short period, namely response characteristics, for directly calculation the current. However, an absolute value is not always correct due to individual difference or secular change of Q, influence of ç or erroneous accumulation of current integrator.

On the other hand, SOCV can be calculated the absolute value with high precision by learning. However, it takes a little period in learning, response characteristics is relatively low in comparison with SOCi. Therefore, by the correction amount calculation procedure 703, variation of SOCV and SOCi in relatively long period is compared to derive the correction amount to correct the item of d I/Q of the equation (6). On the other hand, SOCo is corrected with SOCV at arbitrary timing.

By this, it becomes possible to achieve both of response characteristics of SOCi and high precision calculation of SOCV. On the other hand, the correction amount is derived by comparing the results of calculation per se to feed back the results of calculation for subsequent calculation to repeat learning calculation. Since precision can be improved. Furthermore, since the individual difference of Q, secular change, influence of ç and accumulation of error in the current integrator can be corrected by learning calculation based on SOCV, these correction parameters are not required. Accordingly, it becomes possible to eliminate significant period and load spent for obtaining these parameters or data.

In addition, as the calculation procedure A 701, similar effect can be obtained using SOC calculated from the resistance of the power storage means or SOC calculated from electrolyte concentration.

Figure 7:
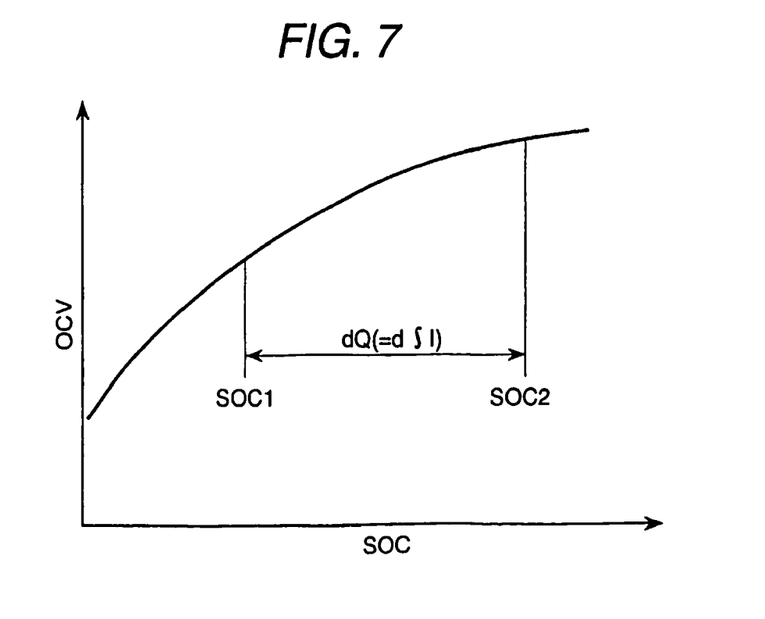
FIG. 7 is a diagrammatic illustration showing a relationship of OCV and SOC of the power storage means according to the present invention.

FIG. 7 is a diagrammatic illustration showing a relationship between OCV and SOC of the power storage means.

Associating with increase of SOC, OCV is increased gradually. Such relationship of SOC and OCV is shown in many of power storage means, such as lithium secondary battery, electric double layer capacitor and so forth.

FIFTH EMBODIMENT

In the shown embodiment, using the characteristics of the power storage means of FIG. 7, the maximum chargeable charge amount (full capacity) Q can be derived. For example, assuming that two different charge states are SOC1 and SOC2, residual capacity corresponding to these are Q1 and Q2 and current integrated value there between is dQ (=d I), the following equations (8) to (11) are established:

$$SOC1 = 100 \times Q1/Q \quad (8)$$

$$SOC2 = 100 \times Q2/Q \quad (9)$$

$$SOC1 - SOC2 = 100 \times (Q1-Q2)/Q = 100 \times dQ/Q \quad (10)$$

$$Q = 100 \times dQ/(SOC1-SOC2) \quad (11)$$

Thus, full capacity Q of the power storage means can be derived. Similarly, full capacity Q can be derived using SOC derived from the electrolyte concentration or internal resistor and the current integration value.

Then, by feeding back Q thus derived to the equation (6), influences of individual difference of Q and secular change can be corrected to permit further precise state detection. On the other hand, correction parameter of the individual difference and secular change becomes unnecessary to eliminate significant time and load required for obtaining parameters and data.

SIXTH EMBODIMENT

Table 2 is a table showing a relationship of the correction coefficient K of the full capacity Q relative to the initial capacity Q0 of the power storage means. In this embodiment, a ratio between the initial capacity of the power storage means stored in the storage means and the full capacity Q derived from the equation (11) is derived to obtain a correction coefficient K depending thereon.

TABLE 2

| Q/Qo | 1.0 | 0.9 | 0.8 | 0.7 | 0.6 | 0.5 |
|---|---|---|---|---|---|---|
| κ | 1.0 | 0.81 | 0.64 | 0.49 | 0.36 | 0.25 |

In general, the power storage means decreases the full capacity associating with secular change. At the same time, the internal resistance is increased. A continuous charge and discharge period derived from the residual capacity, allowable charge current and allowable discharge current derived from equations (3) and (4) and allowable heat generation amount (or cooling control) or allowable charge and discharge power and so forth have to be corrected the initial values depending upon secular change. The foregoing correct coefficient is used for correction of these. Then, these values are preferably optimized depending upon the kind or system of the power storage means.

As set forth above, with the present invention, influences of individual difference or secular change of the continuous charge and discharge period, allowable charge current and allowable discharge current and allowable heat generation amount (or cooling control) or allowable charge and discharge power and so forth is corrected to permit more precise state detection. On the other hand, these correction parameters becomes unnecessary. Accordingly, it becomes possible to eliminate significant period and load spent for obtaining these parameters or data.

SEVENTH EMBODIMENT

Figure 8:
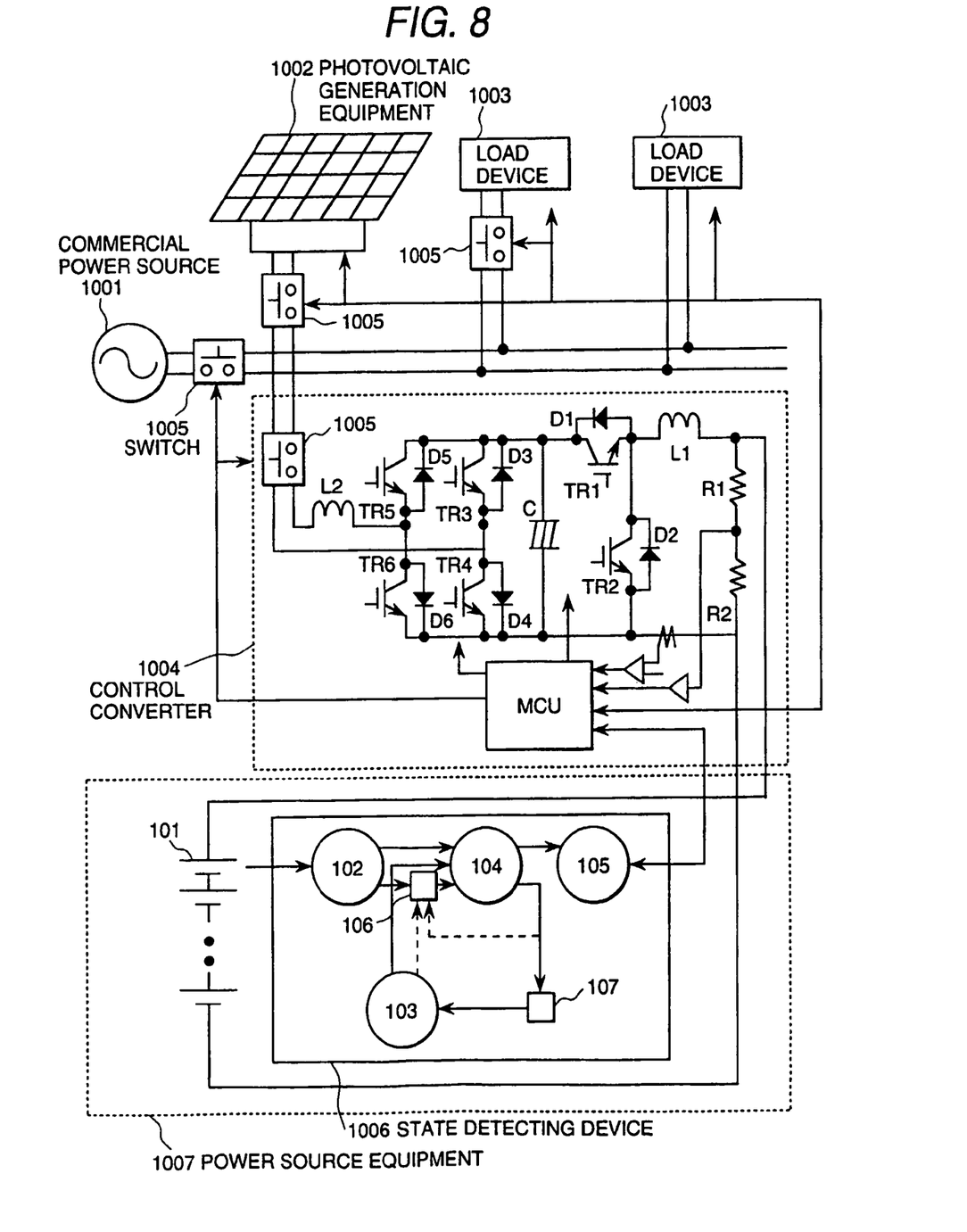
FIG. 8 is a constructional illustration of a distributed type power storage device of sunlight applied the state detection system and the power source unit according to the present invention.

FIG. 8 is a constructional illustration of a photovoltaic generation equipment, to which the state detection system and the power source unit according to the present invention is applied. In FIG. 8, the reference numeral 1001 denotes a commercial power source, 1002 denotes a photovoltaic generation equipment, 1003 denotes a load device, 1004 denotes a control converter, 1005 denotes a switch, 1006 denotes a state detecting device and 1007 denotes a power source unit.

The state detecting device 1006 is constructed with the measuring means 102, the storage means 103, the arithmetic means 104, the communication means 105, the first correction means 106 and the second correction means 107. On the other hand, the power source unit 1007 is constructed with a series connected circuit in which a plurality of power storage means 101 connected in series, and the state detecting device 1006.

Both ends of the series connected circuit of the power storage means 101 is connected to the control converter 1004. The control converter 1004 is further connected to the commercial power source 1001, the photovoltaic generation equipment 1002 and the load device 1003 via the switches 1005 respectively. On the other hand, by a control of a main control unit (MCU) of the control converter 1004, the commercial power source 1001, the photovoltaic generation equipment 1002m the load device 1003 are switched by the switches 1005. Also, a command from the state detection device 1005 is connected by bidirectional communication between the communication means 105 and the MCU.

The photovoltaic generation equipment is an equipments to convert a sun light into a direct current by solar cells and to output an alternating current power by an inverter device. On the other hand, the load device 1003 is a household electric equipment, such as an air conditioner, a refrigerator, an electronic oven, lighting and so forth, an electric equipment, such as a motor, an elevator, a computer, a medical equipment and so forth, or a secondary power source unit. Then, the control converter 1004 is a charge and discharge device which converts the alternating current power into the direct current power or converts the direct current power into the alternating current power, and also serves as a controller for controlling charge and discharge and controlling the equipments, such as the photovoltaic generation equipment 1002, the load device 1003 and so forth.

Here, these equipment may incorporate the switch 1005 therein. On the other hand, the power source unit according to the present invention mat take connection other than those illustrated herein. With the shown embodiments, when a sufficient power required by the load device 1003 cannot be supplied from the commercial power source 1001 or the photovoltaic generation equipment 1002, the power is supplied from the power storage means 101 via the control converter 1004. On the other hand, when power supply from the commercial power source 1001 or the photovoltaic generation equipment 1002 becomes excessive, the excessive power is stored in the power storage means 101 via the control converter 1004.

During these operation, the state detecting device 1007 may detect state of the power storage means 101 by each of the first to the sixth embodiments or the combination thereof. For combination of these, syllogism is applied. On the other hand, the result of state detection is fed to the control converter 1004 as a control amount for state or allowable charge and discharge current and so forth of the power storage means 101. The control converter 1004 controls charging and discharging depending thereon. Particularly, since the state detection device 1007 can perform high precision state detection, the power storage means 101 can be used safely and effectively.

On the other hand, in the embodiment shown, it becomes possible to lower contract demand or power consumption of the commercial power source 1001 and to lower rated power to be generated by the photovoltaic generation equipment 1002 to permit reduction of investment or running cost. When power consumption is concentrated to a certain time zone, the power is supplied to the commercial power source 1001 from the power source unit, and during a time zone where power consumption is small, power is accumulated in the power source unit to absorb concentration of power consumption and to equalize power consumption.

Furthermore, the control converter 1004 monitors power consumption of the load device 1003 and controls the load device 1003. Therefore, power saving and effective use of the power can be achieved. Asset forth above, with the shown embodiment, the state detection method, the state detection system of the power storage means in high precision and with smaller number of characteristic data to be used for calculation, and the power source unit, distribution type power storage device employing the same can be realized.

EIGHTH EMBODIMENT

Figure 9:
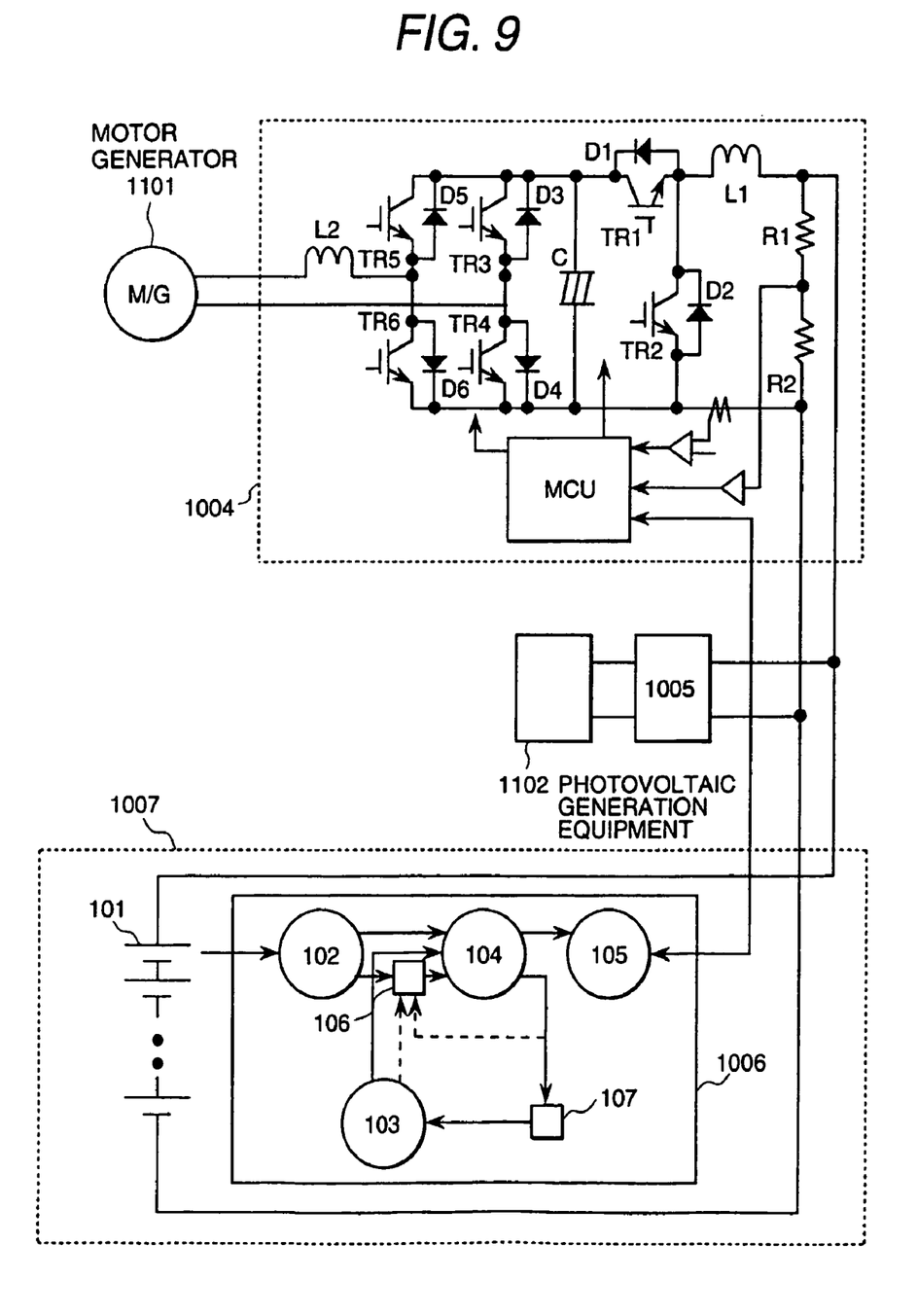
FIG. 9 is a constructional illustration of an automotive vehicle applied the state detection system and the power source unit according to the present invention.

FIG. 9 is a constructional illustration showing an embodiment of an electric vehicle, to which the state detection system and the power source unit according to the present invention is applied. In FIG. 9, the reference numeral 1101 denotes a motor generator, 1102 denotes a direct current load device. The motor generator 1101 is connected to the series connected circuit of a plurality of power storage means 101 via the control converter 1004. The motor generator 1101 is directly coupled with a wheel in case of the electric vehicle. In case of a hybrid electric vehicle, an internal combustion engine is further coupled for assisting start-up or driving force (power running) and generation (re-generation). During power running, power is supplied from the power source unit 1007 to the motor generator 1101. During re-generation, power is supplied from the power generator 1101 to the power source unit 1007.

On the other hand, the direct current load device 1102 is an electric load, such as electromagnetic vale, audio unit and so forth, or the secondary power source unit. The direct current load device 1102 is connected to the series connected circuit of the power storage means via the switch 1005.

Even in the shown embodiment, the state detection device 1007 may employ respective of the first to sixth embodiment or combination thereof. Via the communication means, state of the power storage means 101 or control amount of the allowable charge and discharge current or the like is fed to the control converter 1004 so that the control converter 1004 may control charging and discharging depending thereon. Particularly, since the state detection device 1007 may perform state detection with high precision, the power storage means 101 may be used safely and effectively.

By this, the hybrid electric vehicle which can assist to a torque of the internal combustion engine upon star-running and can accumulate kinetic energy by converting into electric power, can be realized.

With the present invention, by performing correction with feeding back the correction information obtained by predetermined arithmetic operation for the subsequent calculation and storage information for calculation, it becomes possible to provide the state detection system which can detect state, such as state of charge or state of health of the power storage means with high precision even when amount of characteristic data to be used for calculation is small, the power source unit, power storage device and electric vehicle employing the same.

What is claimed is:

1. A state detecting system comprising:
a memory means for storing
a characteristic data of power storage means, obtained by calculation from an measured information obtained by measuring a measuring object of power storage means by way of measurement means;
a calculation information required for said calculation for said characteristic data; and
a set information to be defined for a characteristic or phenomenon specific to said power storage means as true set value or true logic, said set information set in advance;
an arithmetic means for
inputting an information stored in said memory means and said measured information as an input information;
calculating a state information indicating a state of said power storage means based on said input information and said calculation information; and
calculating a correction information for correcting an information stored in said memory means or said input information in case that it is required to correct an information stored in said memory means or said input information by comparing a result obtained by said calculation and said set information; and a correcting means for correcting said input information or an information stored in said memory means based on said correction information, wherein
when a current value in said power storage means is smaller than or equal to a predetermined value, one of a measured value by said measuring means, said result of calculation and a calculation procedure of said arithmetic means is taken as said set information to derive said correction information.

2. A state detecting system comprising:
a memory means for storing
a characteristic data of power storage means, obtained by calculation from an measured information obtained by measuring a measuring object of power storage means by way of measurement means;
a calculation information required for said calculation for said characteristic data; and
a set information to be defined for a characteristic or phenomenon specific to said power storage means as true set value or true logic, said set information set in advance;
an arithmetic means for
inputting an information stored in said memory means and said measured information as an input information;
calculating a state information indicating a state of said power storage means based on said input information and said calculation information; and calculating, when a charge state is decreased during charging or when the charge state is increased during discharging a correction information for correcting an information stored in said memory means or said input information in case that it is required to correct an information stored in said memory means or said input information by comparing a result obtained by said calculation and said set information; and a correcting means for correcting said input information or an information stored in said memory means based on said correction information.

3. A state detecting system as claimed in claim 2, wherein said storage means stores more than or equal to two mutually distinct calculation procedures, and
said correction information is derived on the basis of a difference of results of calculation by mutually distinct calculation procedures by said arithmetic means.

4. A state detecting system as claimed in claim 2, wherein said arithmetic means has a charge state calculating means and a current integration means, and a capacity of said power storage means on use is calculated on the basis of two mutually different charge states and respective current integrated values.

5. A state detecting system as claimed in claim 2, wherein said correction information is derived on the basis of relationship between a capacity of said power storage means in use and an initial capacity of said power storage means.

6. A state detecting system as claimed in claim 2, wherein said correction information is derived on the basis of difference between variation amounts of a current integrated value of said power storage.

7. A state detecting system as claimed in claim 2, wherein said measured information is at least one of voltage, current, temperature, resistance and electrolyte concentration.

8. A state detecting system as claimed in claim 2, wherein said calculation information is at least one of calculation coefficient and calculation procedure.

9. A state detecting system as claimed in claim 2, wherein said set information is at least one of a value set as a state which should be in normal condition in said power storage means, arithmetic expression and calculation procedure.

10. A state detecting system as claimed in claim 2, wherein
said state information is at least one of charge state and residual capacity of said power storage means.

11. A state detecting system as claimed in claim 2, which further comprises communication means for communicating the calculation result obtained from said arithmetic means to another device.

12. A power supply apparatus comprising:
a measuring means for measuring at least one of voltage, current, temperature, electric resistance and electrolyte concentration of said power storage means; and
a state detecting system for obtaining a state information of said power storage means based on a measured information measured by said measuring means; wherein
said state detecting system comprises a state detecting system of claim 2.

13. A power storage means connected to a set of a commercial power source, a photovoltaic generation device and a load device, said set being connected mutually via selector switch, comprising:

a control converter connected via selector switch to a set of a commercial power source, a photovoltaic generation device and a load device, said set being connected mutually via selector switch;
a control apparatus for controlling an operation of selector switch and an operation of said control converter;
a power storage means connected to said control converter;
a measuring means for measuring at least on of voltage, current, temperature, electric resistance and electrolyte concentration of said power storage means; and
a state detecting system for obtaining a state information of said power storage means based on a measured information measured by said measuring means, wherein
said control converter controls an electric power between a set of a commercial power source, a photovoltaic generation device and a load device, said set being connected mutually via selector switch, and said power storage means;
said state detecting system comprises a state detecting system of claim 2; and
said control apparatus control an operation of said control converter based on an information provided by said state detection apparatus.

14. An apparatus for electric vehicle comprising:
a motor for driving a wheel;
a generator for generating electricity by means of rotation of said wheel;
a control converter connected to said motor and said generator;
a control apparatus for controlling an operation of said control converter;
a power storage means connected to said control converter;
a measuring means for measuring at least on of voltage, current, temperature, electric resistance and electrolyte concentration of said power storage means; and
a state detecting system for obtaining a state information of said power storage means based on a measured information measured by said measuring means, wherein
said control converter control electric power between said motor and said generator and said power storage means;
said state detecting system comprises a state detecting system of claim 2;
said state detecting system and said control apparatus may communicate each other by way of a communication means; and
said control apparatus controls an operation of said control converter based on an information provided by said state detecting system.

15. An apparatus for hybrid vehicle comprising:
a motor for assisting to drive a wheel driven by an internal combustion engine;
a generator for generating electricity by means of rotation of said wheel;
a control converter connected to said motor and said generator;
a control apparatus for controlling an operation of said control converter;
a power storage means connected to said control converter;
a measuring means for measuring at least one of voltage, current, temperature, electric resistance and electrolyte concentration of said power storage means; and a state detecting system for obtaining a state information of said power storage means based on a measured information measured by said measuring means, wherein said control converter control electric power between said motor and said generator and said power storage means;

said state detecting system comprises a state detecting system of claim 2;

wherein said state detecting system and said control apparatus communicate each other by way of a communication means; and said control apparatus controls an operation of said control converter based on information provided by said state detecting system.

16. A state detecting system comprising:

a memory means for storing a characteristic data of power storage means, obtained by calculation from a measured information obtained by measuring a measuring object of power storage means by way of measurement means;

a calculation information required for said calculation for said characteristic data; and a set information to be defined for a characteristic or phenomenon specific to said power storage means as true set value or true logic, said set information set in advance;

an arithmetic means for inputting an information stored in said memory means and said measured information as an input information;

calculating a state information indicating a state of said power storage means based on said input information and said calculation information; and calculating a correction information for correcting an information stored in said memory means or said input information in case that it is required to correct an information stored in said memory means or said input information by comparing a result obtained by said calculation and said set information; wherein said arithmetic means comprises a means for calculating charge state of said power storage means and a means for integrating current of said power storage means; and calculate an in-use capacity of said power storage means based on two different charge states and their current integration values.

17. A state detecting system comprising:

a memory means for storing a characteristic data of power storage means, obtained by calculation from a measured information obtained by measuring a measuring object of power storage means by way of measurement means;

a calculation information required for said calculation for said characteristic data; and a set information to be defined for a characteristic or phenomenon specific to said power storage means as true set value or true logic, said set information set in advance;

an arithmetic means for inputting an information stored in said memory means and said measured information as an input information;

calculating a state information indicating a state of said power storage means based on said input information and said calculation information; and calculating a correction information for correcting an information stored in said memory means or said input information in case that it is required to correct an information stored in said memory means or said input information by comparing a result obtained by said calculation and said set information; wherein said arithmetic means obtains said correction information based on a difference between a change in the current integration value of said power storage means and a change in the current integration value obtained by said arithmetic means.

18. A state detecting system comprising:

a memory means for storing a characteristic data of power storage means, obtained by calculation from an measured information obtained by measuring a measuring object of power storage means by way of measurement means;

a calculation information required for said calculation for said characteristic data; and a set information to be defined for a characteristic or phenomenon specific to said power storage means as true set value or true logic, said set information set in advance;

an arithmetic means for inputting an information stored in said memory means and said measured information as an input information;

calculating a state information indicating a state of said power storage means based on said input information and said calculation information; and calculating a correction information for correcting an information stored in said memory means or said input information in case that it is required to correct an information stored in said memory means or said input information by comparing a result obtained by said calculation and said set information; and a correcting means for correcting said input information or an information stored in said memory means based on said correction information, wherein said correcting means updates the correcting based on obtained results while learning, wherein said arithmetic means has a charge state calculating means and a current integration means, and a capacity of said power storage means on use is calculated on the basis of two mutually different charge states and respective current integrated values.

19. A state detecting system as claimed in claim 18, wherein said storage means stores more than or equal to two mutually distinct calculation procedures, and said correction information is derived on the basis of a difference of results of calculation by mutually distinct calculation procedures by said arithmetic means.

20. A state detecting system as claimed in claim 18, wherein said correction information is derived on the basis of relationship between a capacity of said power storage means in use and an initial capacity of said power storage means.

21. A state detecting system comprising:

a memory means for storing a characteristic data of power storage means, obtained by calculation from an measured information obtained by measuring a measuring object of power storage means by way of measurement means;

a calculation information required for said calculation for said characteristic data; and a set information to be defined for a characteristic or phenomenon specific to said power storage means as true set value or true logic, said set information set in advance;

an arithmetic means for
inputting an information stored in said memory means and said measured information as an input information;
calculating a state information indicating a state of said power storage means based on said input information and said calculation information; and
calculating a correction information for correcting an information stored in said memory means or said input information in case that it is required to correct an information stored in said memory means or said input information by comparing a result obtained by said calculation and said set information; and a correcting means for correcting said input information or an information stored in said memory means based on said correction information, wherein said correction information is calculated when there is overcharging or over-discharging detected during charging or discharging at a current smaller than or equal to a maximum allowable value, wherein
said arithmetic means has a charge state calculating means and a current integration means, and a capacity of said power storage means on use is calculated on the basis of two mutually different charge states and respective current integrated values.

22. A state detecting system as claimed in claim 21, wherein
said storage means stores more than or equal to two mutually distinct calculation procedures, and
said correction information is derived on the basis of a difference of results of calculation by mutually distinct calculation procedures by said arithmetic means.

23. A state detecting system as claimed in claim 21, wherein
said correction information is derived on the basis of relationship between a capacity of said power storage means in use and an initial capacity of said power storage means.

24. A state detecting system comprising:
a memory means for storing
a characteristic data of power storage means, obtained by calculation from an measured information obtained by measuring a measuring object of power storage means by way of measurement means;
a calculation information required for said calculation for said characteristic data; and
a set information to be defined for a characteristic or phenomenon specific to said power storage means as true set value or true logic, said set information set in advance;
an arithmetic means for
inputting an information stored in said memory means and said measured information as an input information;
calculating a state information indicating a state of said power storage means based on said input information and said calculation information; and
calculating a correction information for correcting an information stored in said memory means or said input information in case that it is required to correct an information stored in said memory means or said input information by comparing a result obtained by said calculation and said set information; and a correcting means for correcting said input information or an information stored in said memory means based on said correction information, wherein said correction information is a direction of connection, and the correcting means corrects the input information or the information stored in the memory means by a preset amount in said direction of correction, wherein
said arithmetic means has a charge state calculating means and a current integration means, and a capacity of said power storage means on use is calculated on the basis of two mutually different charge states and respective current integrated values.

25. A state detecting system as claimed in claim 24, wherein
said correction information is derived on the basis of relationship between a capacity of said power storage means in use and an initial capacity of said power storage means.

* * * * *